United States Patent
de Bakker et al.

(10) Patent No.: US 10,976,366 B2
(45) Date of Patent: Apr. 13, 2021

(54) TWO PIN SCAN INTERFACE FOR LOW PIN COUNT DEVICES

(71) Applicant: Silicon Laboratories Inc., Austin, TX (US)

(72) Inventors: Patrick J. de Bakker, Hollis, NH (US); Michael R. May, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/165,058

(22) Filed: Oct. 19, 2018

(65) Prior Publication Data
US 2020/0124665 A1 Apr. 23, 2020

(51) Int. Cl.
*G01R 31/28* (2006.01)
*G01R 31/3177* (2006.01)
*G01R 31/317* (2006.01)

(52) U.S. Cl.
CPC ... *G01R 31/3177* (2013.01); *G01R 31/31701* (2013.01); *G01R 31/31726* (2013.01); *G01R 31/31727* (2013.01)

(58) Field of Classification Search
CPC .......... G01R 31/3177; G01R 31/31726; G01R 31/31701; G01R 31/31727; G01R 31/318533; G01R 31/318536; G11C 2029/3202
USPC ........................................ 714/724, 726, 727
See application file for complete search history.

(56) References Cited

U.S. PATENT DOCUMENTS

| | | | | |
|---|---|---|---|---|
| 5,623,503 A | * | 4/1997 | Rutkowski | G01R 31/31858 714/727 |
| 7,131,044 B2 | * | 10/2006 | Whetsel | G01R 31/31721 714/726 |
| 2002/0057108 A1 | * | 5/2002 | Kono | G01R 31/31853 326/104 |
| 2003/0204801 A1 | * | 10/2003 | Tkacik | G01R 31/31719 714/726 |
| 2007/0143653 A1 | | 6/2007 | Doorenbos et al. | |

(Continued)

OTHER PUBLICATIONS

MacDonald, "Design for Testability," UTEP EE5375-ADD II, downloaded from www.ece.utep.edu/courses/web5375/Notes_files/ee5375_dft.pdf, Jul. 31, 2018, 24 pages.

(Continued)

*Primary Examiner* — Albert Decady
*Assistant Examiner* — Osman M Alshack
(74) *Attorney, Agent, or Firm* — Zagorin Cave LLP

(57) ABSTRACT

A scan controller provides a translation between a two terminal external interface and a four signal line internal scan interface to a digital core of the integrated circuit. The two terminal external interface has an input terminal and an input/output terminal. The input terminal receives a clock signal and the input/output terminal serially receives a scan enable signal and a scan in data bit. A state machine controls the scan controller. The scan in data bit, the scan enable signal, and a scan clock signal are supplied in parallel to the internal scan interface. The digital logic provides a scan out data bit and the scan controller supplies the scan out data bit over the input/output terminal in synchronism with the clock signal.

18 Claims, 7 Drawing Sheets

(56) References Cited

U.S. PATENT DOCUMENTS

| | | | | |
|---|---|---|---|---|
| 2009/0193305 A1* | 7/2009 | Liu | ............... | G01R 31/31855 714/727 |
| 2010/0281316 A1* | 11/2010 | Miyato | ............ | G01R 31/31853 714/726 |
| 2013/0311843 A1* | 11/2013 | Tekumalla | ....... | G01R 31/31855 714/729 |
| 2015/0185285 A1* | 7/2015 | Kovalev | ............ | G01R 31/3172 714/727 |
| 2015/0285861 A1* | 10/2015 | Whetsel | ........... | G01R 31/31853 714/727 |
| 2016/0274185 A1* | 9/2016 | Nishikawa | ....... | G01R 31/31853 |

OTHER PUBLICATIONS

Moreau, J., et al., "Running Scan Test on Three Pins: Yes We Can!," International Test Conference, 2009, pp. 1-10.

\* cited by examiner

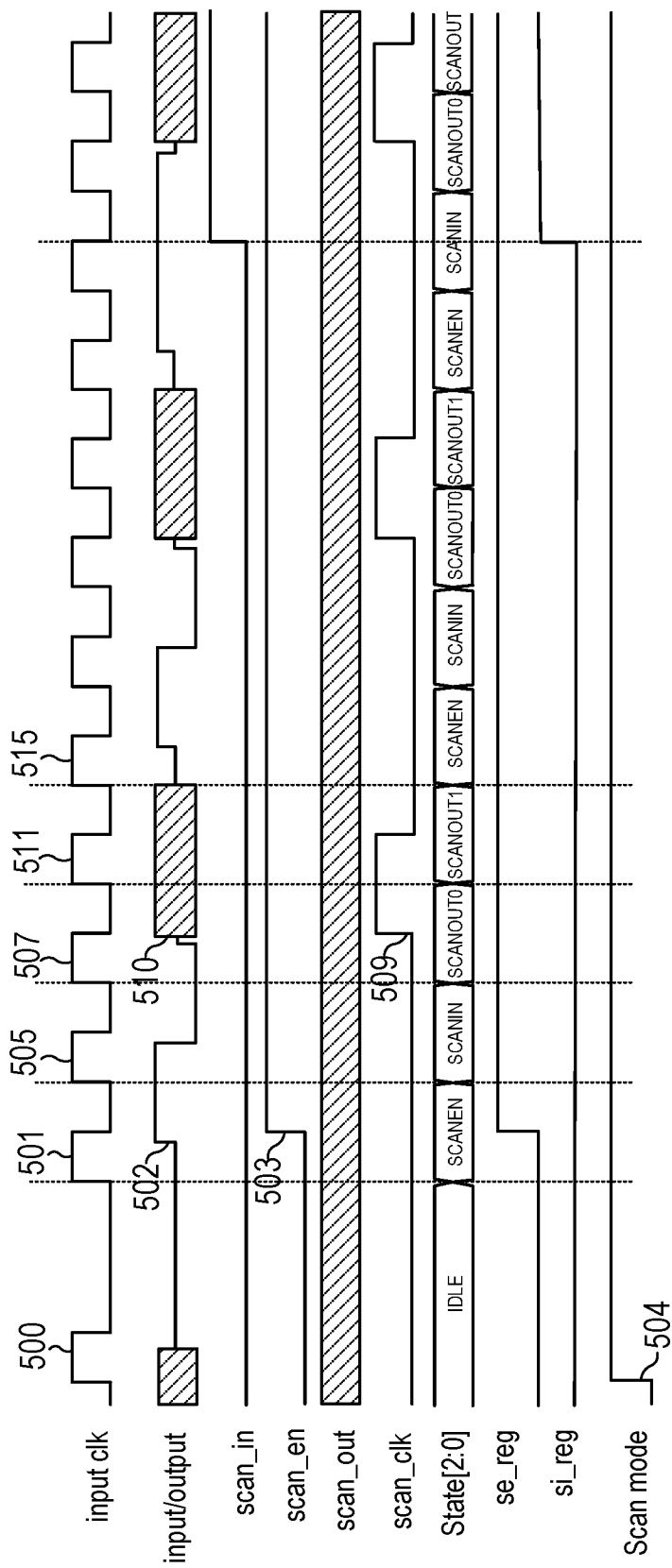

TWO PIN SCAN INTERFACE FOR LOW PIN COUNT DEVICES

BACKGROUND

Field of the Invention

This disclosure relates to scan of integrated circuits and more particularly to scan operations in pin limited environments.

Description of the Related Art

Scan is a well known technique for integrated circuits in which storage elements such as flip-flops and registers are connected serially in one or more scan strings to provide test and debug access. The access can be used to load test vectors into the internal storage elements of the integrated circuit and to view internal results of operations of the integrated circuit to help in test and debug. FIG. 1 illustrates a conventional scan chain implementation for an integrated circuit. In scan mode, the flip-flops 101, 103, and 105 appear as a serial chain of flip-flops. To implement a scan architecture, when scan enable (SCAN EN) is asserted, flip-flops 101, 103, and 105 receive the scan inputs 102, 104, and 106 supplied to the multiplexers 107, 109, and 111. Multiplexer 115 selects the scan clock (if desired) instead of the system clock to shift data through the scan chain. In functional mode, with scan enable deasserted, the multiplexers 107, 109 and 111 select functional inputs as inputs to their respective flip-flops and multiplexer 115 selects the system clock.

FIG. 2 illustrates a timing diagram associated with a typical four pin scan interface that includes a scan clock (Scan_Clk), the scan enable signal (Scan_En), scan data in (Scan_In) and scan data out (Scan_Out). In the example of FIG. 2, scan data is provided on Scan_In before the rising edge of the scan clock and the rising edge of the scan clock causes data to shift through the scan chain. The last flip-flop in the scan chain supplies its data on scan out.

SUMMARY OF EMBODIMENTS OF THE INVENTION

While scan architectures prove useful for test and debug of integrated circuits, utilizing the four signal scan interface is difficult in pin limited environments. Accordingly, an embodiment provides a method that includes receiving a scan enable signal and a scan in data bit serially on an input/output terminal of an integrated circuit. An input clock is received on an input terminal of the integrated circuit. The scan in data bit, the scan enable signal, and a scan clock signal are supplied in parallel to an internal scan interface of the integrated circuit, the internal scan interface including a scan enable signal line, a scan in signal line, a scan out signal line and a scan clock signal line. In an embodiment, the method further includes receiving a scan out data bit from the digital logic over the scan out signal line and supplying the scan out data bit to the input/output terminal in synchronism with the clock signal.

In another embodiment an integrated circuit includes a two terminal external interface including an input terminal to receive a clock signal and an input/output terminal to serially receive a scan enable signal and scan in data and to supply scan out data. A scan controller is coupled to the two terminal external interface and coupled to digital logic of the integrated circuit through an internal scan interface, the internal scan interface including a scan clock signal line, a scan in signal line, a scan out signal line, and a scan enable signal line. The scan controller communicates in parallel with the internal scan interface to supply a scan clock to the scan clock signal line, the scan in data to the scan in signal line, the scan enable signal to the scan enable signal line and to receive the scan data out over the scan out signal line. The scan controller further includes a state machine to control scan operations using the two terminal external interface and the internal scan interface.

In another embodiment, a method of performing scan operations in an integrated circuit includes writing a control location in an integrated circuit through a write operation using an input terminal and an input/output terminal to cause the integrated circuit to enter a scan mode enabling use of a two terminal external interface including the input/output terminal and the input terminal for scan operations. After entering scan mode, a state machine in a scan controller in the integrated circuit transitions from an idle state to a scan enable state responsive to a first transition of the input clock signal received on the input terminal. While in the scan enable state, a value of the input/output terminal is stored into a scan enable storage element responsive to a second transition of the input clock signal. The state machine transitions from the scan enable state to a scan in state responsive to a third transition of the input clock signal. While in the scan in state of the state machine, a value of the input/output terminal is stored into a scan in data storage element responsive to a fourth transition of the input clock signal. The state machine transitions from the scan in state to a scan out state responsive to a fifth transition of the input clock signal. While in the scan out state of the state machine, a scan clock signal coupled to an internal scan interface of digital logic of the integrated circuit is asserted while the scan interface is supplied respective outputs of the scan in data storage element and the scan enable storage element.

BRIEF DESCRIPTION OF THE DRAWINGS

The present invention may be better understood, and its numerous objects, features, and advantages made apparent to those skilled in the art by referencing the accompanying drawings.

FIG. 5A illustrates a timing diagram associated with an embodiment of a scan controller in a pin limited environment.

The use of the same reference symbols in different drawings indicates similar or identical items.

DETAILED DESCRIPTION

For chips with a low pin count (less than 4 functional pins), traditional digital scan cannot be used, since traditional scan requires a minimum of 4 pins (scan_en, scan_clk, scan_in and scan_out). Embodiments herein provide scan capability for integrated circuits with as few as 2 functional pins, thus providing the scan benefits for low pin count devices similar to the scan benefits traditionally enjoyed by the higher pin count devices. Providing scan capability for low pin count devices provides better test coverage on packaged parts (traditionally these low pin count devices would only use scan test during the die test) and easier silicon debug when a customer returns parts.

Figure 1:
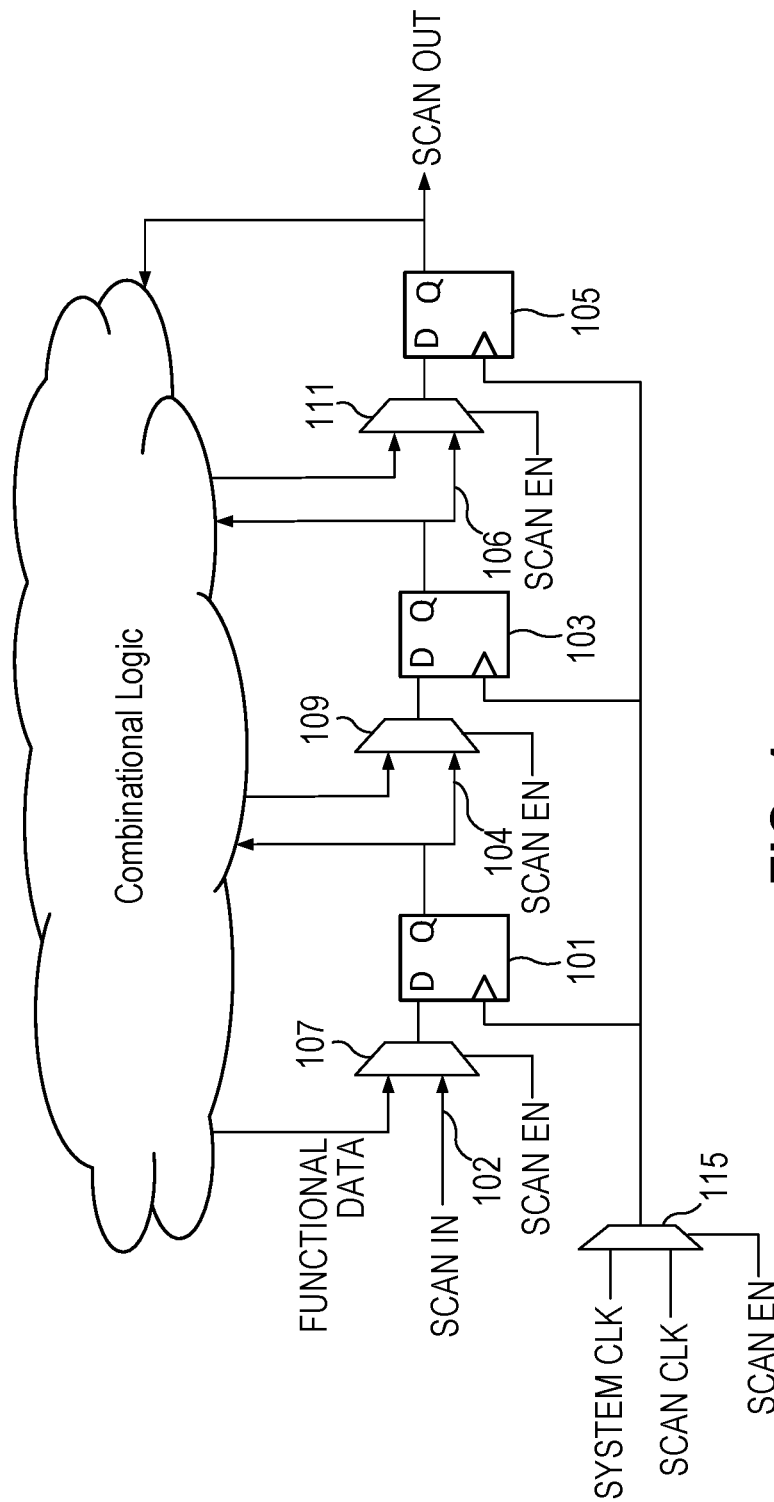
FIG. 1 illustrates a conventional scan architecture.
Figure 2:
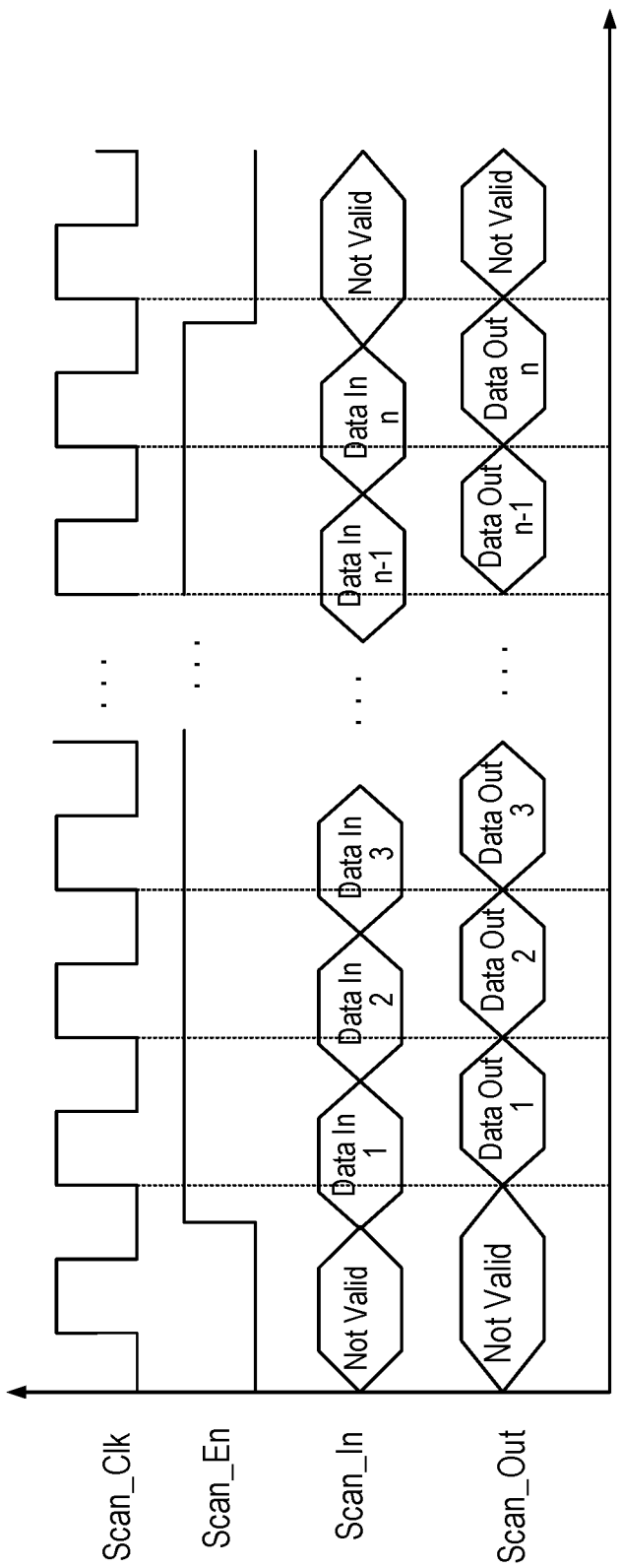
FIG. 2 illustrates a timing diagram associated with the conventional scan architecture of FIG. 1.
Figure 3:
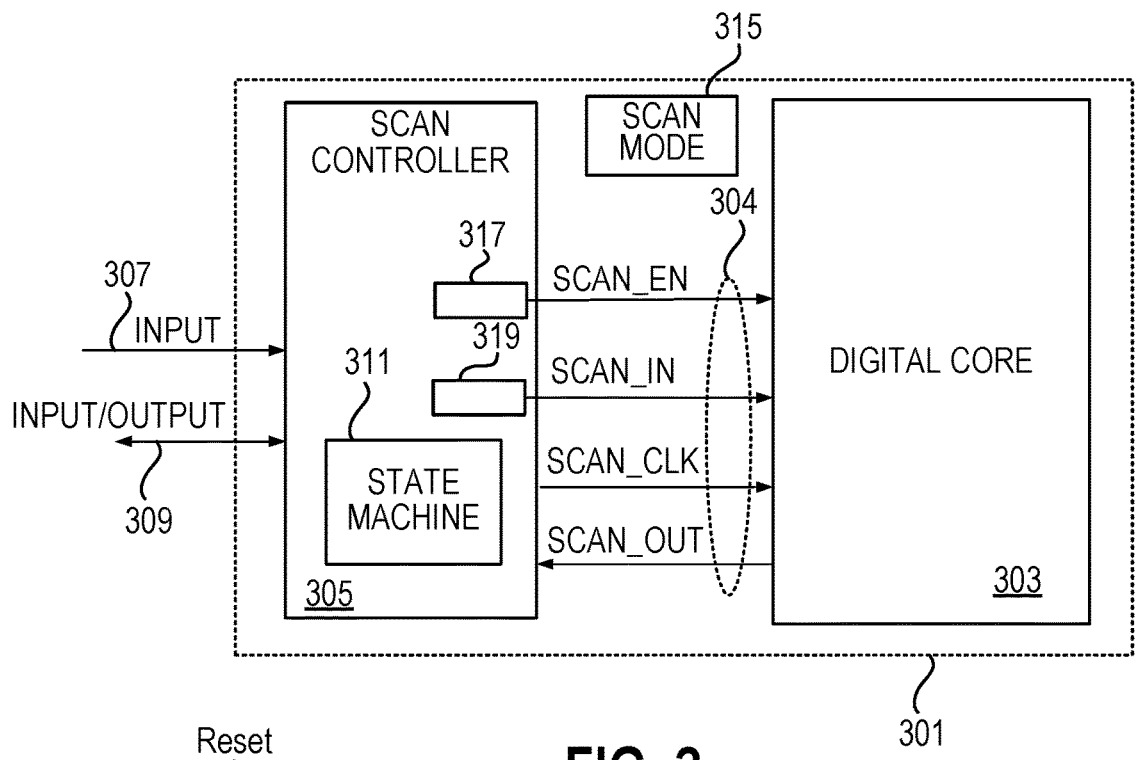
FIG. 3 illustrates a high level block diagram of an embodiment of a scan architecture for a pin limited environment.

FIG. 3 illustrates the basic architecture for a two pin scan embodiment for an integrated circuit 301. The integrated circuit 301 includes a digital core 303 that has a traditional four signal scan interface 304 that is internal to the integrated circuit and a scan controller 305. The scan controller 305 interfaces with two external terminals (also referred to herein as pins) 307 and 309 of integrated circuit 301 to implement a serial interface. Pins 307 and 309 supply logic controlled by a finite state machine 311 that converts the two pin interface to the traditional four signal scan interface 304 used by the digital core 303.

In an embodiment the input terminal 307 is an input terminal that receives an input clock signal and terminal 309 is an input/output terminal that receives scan enable, scan in data, and supplies scan out data. Dedicating one terminal 307 to the input clock offers more flexibility to run the scan operation at different clock speeds and defines the time at which inputs and outputs are on the two terminal external interface.

The integrated circuit includes scan mode control register 315 that is writable over the two terminal external interface to cause the integrated circuit to enter scan mode thereby enabling use of the two terminal external interface for scan operations. In an embodiment, once in scan mode, the integrated circuit needs a power cycle to obtain a power on reset to exit the scan mode.

Figure 4:
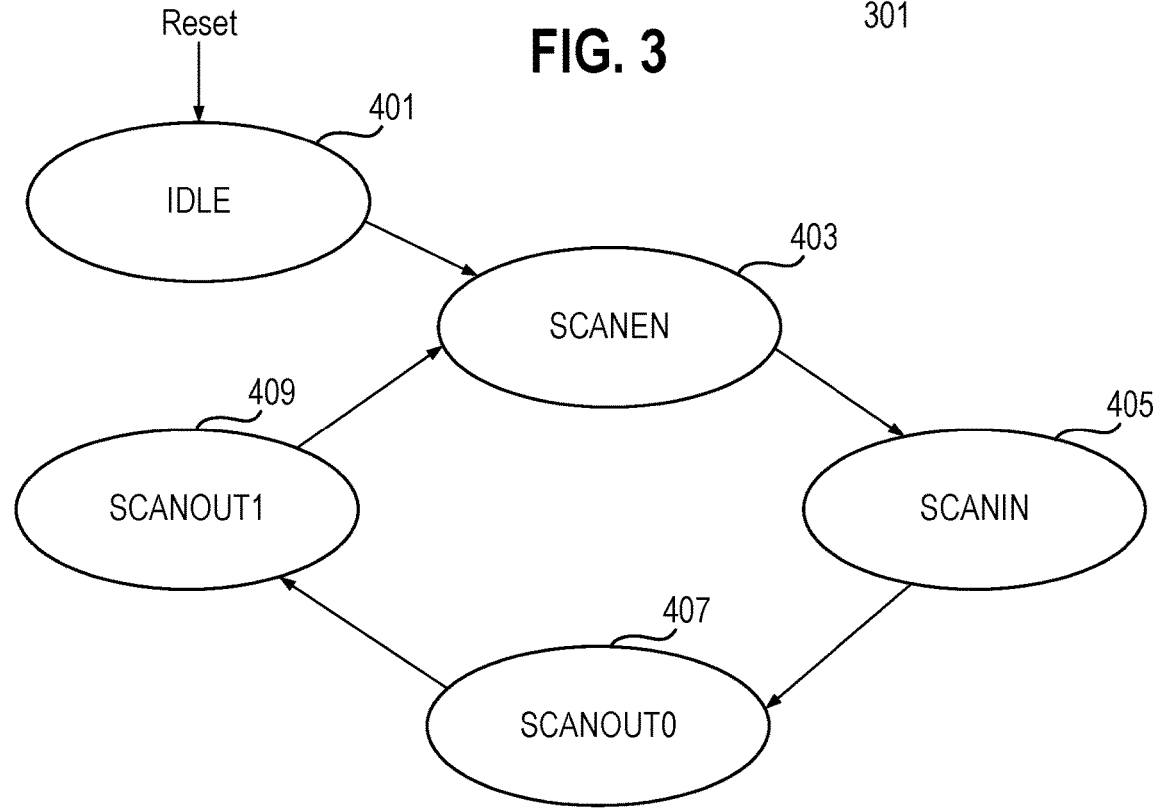
FIG. 4 illustrates a state diagram associated with an embodiment of a scan controller in a pin limited environment.

FIG. 4 illustrates an embodiment of the finite state machine 311 used in scan controller 305. The state machine enters the idle state 401 responsive to a power-on reset. The input clock signal on input terminal 307 provides the shift clock for state machine 311 to cause the state machine to transition to the next state. After the scan mode control register 315 has been written over the two pin interface with the appropriate value to enable the scan mode, an input clock signal pulse (e.g., the rising edge of the input clock signal) causes the state machine 311 to exit the idle state 401 and enter the scan enable (SCANEN) state 403. Absent writing the scan mode control register 315 to enable scan mode, the state machine remains in the idle state regardless of transitions on the input terminal. In the scan enable state the scan enable signal (scan_en) is loaded from the input/output terminal 309 into a storage element 317, e.g., on the falling edge of the input clock signal pulse. The storage element 317 supplies its contents to the scan enable signal line (SCAN_EN) of the internal scan interface 304. The next clock pulse causes the state machine 311 to exit the scan enable state 403 and enter the scan in (SCANIN) state 405. In the scan in state, data on the input/output terminal 309 is loaded into storage element 319, e.g., on the falling edge of the input clock signal. The scan in signal line (SCAN_IN) of the four pin scan interface 304 receives the contents of storage element 319. The next clock pulse causes the state machine 311 to enter the SCANOUT0 state. In some embodiments, due to constraints of external equipment, the scan out state takes two cycles 407 and 409 of the state machine. In that case, the scan clock of the scan interface 304 is asserted during the SCANOUT0 state and is deasserted during the SCANOUT1 state. The assertion of the scan clock on the internal scan interface causes the scan in data to be clocked into the beginning of the scan chain and the scan chain to shift. The scan out signal line (SCAN_OUT) of the scan interface 304 supplies the scan data from the end of the scan string.

FIG. 5 illustrates a timing diagram of an embodiment associated with the scan operations using the two external terminals of integrated circuit 301, the controller 305 and the scan interface 304. With reference to FIGS. 3-5, in FIG. 5 the state machine (State[2:0]) starts off in the IDLE state after a power on reset (not shown in FIG. 5A). The state machine remains in the IDLE state regardless of activity on the input clock terminal (input clk) and the input/output terminal until the scan mode control bit in a control register 315 is written at 500 (the last clock cycle of the write operation is shown in the timing diagram), which allows the scan controller state machine to exit the IDLE state on a next input clock rising edge. The write operation in an embodiment is a serial write operation with address and data provided over the input/output signal line and a clock provided over the input clock terminal. The scan mode is asserted at 504 at the end of the write operation. While not shown in FIG. 5A, in an embodiment, prior to writing the scan mode control bit, the input clock signal line is at high impedance when not being used. The rising edge of the first input clock pulse 501 after scan mode is enabled causes the state machine to transition to the scan enable (SCANEN) state. The input/output terminal is driven from high impedance to a logical one (high voltage representing one) at 502 by an external test apparatus providing test vectors to the integrated circuit. At the falling edge of the first pulse 501 the value on the input/output signal line is loaded into a storage element 317 in the scan controller 305 and the scan enable signal (scan_en) on the internal scan interface, coupled to the output of the storage element 317 goes from a zero to a one at 503. The rising edge of the next input clock pulse 505 causes the state machine to enter the SCANIN state. The input/output terminal is driven by the external test apparatus with the scan bit and at the falling edge of pulse 505 the value (zero in this instance) of the input/output terminal is stored in the scan_in storage element 319 and the scan in signal line of the scan interface 304 remains at zero. The rising edge of the next pulse 507 causes the state machine to enter the SCANOUT0 state. The test apparatus sets input/output to a high impedance value to allow the two pin interface to drive the input/output terminal with scan out data from the digital core 303. The falling edge of the input clock signal pulse 507 causes the scan_clk pulse at 509, which in turn causes the scan out data from the digital core to be placed on the input/output terminal 309 at 510. In an embodiment, the test equipment compares the scan data on the input/output data to expected data in SCANOUT0. The rising edge of the next pulse 511 causes the state machine to enter the SCANOUT1 state. In the SCANOUT1 state the scan clock scan_clk supplied to the digital core 303 deasserts.

Figure 5B:
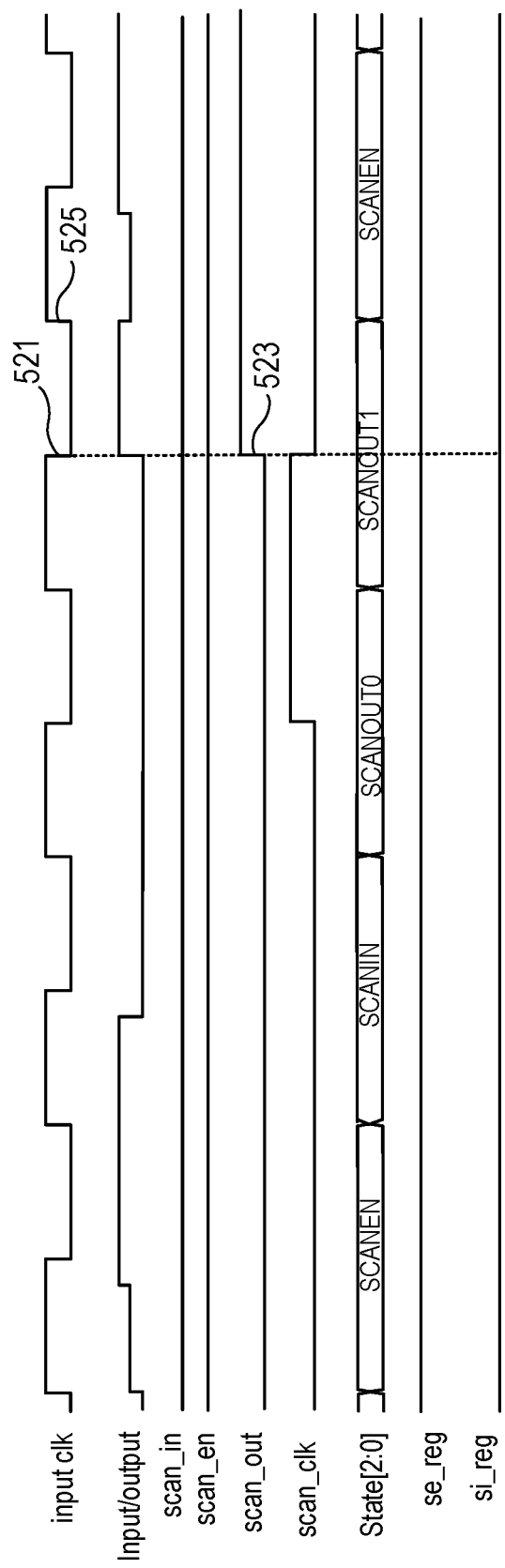
FIG. 5B illustrates a timing diagram showing additional details of the scan operation.

In embodiments there are special vectors generated that do not generate a scan clock pulse. In that case, the previously started scan_clk pulse needs to be completed. The rising edge of the next pulse 515 causes the scan interface to stop driving the input/output terminal and returns the input/output terminal to high impedance. The rising edge of the input clock signal pulse 515 causes the state machine to return to the scan enable state and the scan operation continues until all the test vectors have been scanned in and out for a particular test operation. In an embodiment, the scan mode is only exited by power cycling the integrated circuit to obtain a power on reset FIG. 5B shows an embodiment of the scan out cycle in more detail and when the tester strobes the scan output on the input/output pin. Note that the timing diagram of FIG. 5B assumes that the integrated circuit has already entered scan mode. The scan_out signal of the scan chain is clocked on the falling edge 521 of the internal scan clock (scan_clk). That results in a change of the scan_out value at 523 and the change in value on the input/output terminal at the same time. Note that delays through the circuitry are not shown in the timing diagrams for ease of illustration. Just before the rising edge of the input clock signal at 525, the tester strobes the scan_out value and compares it with the expected value.

Figure 6:
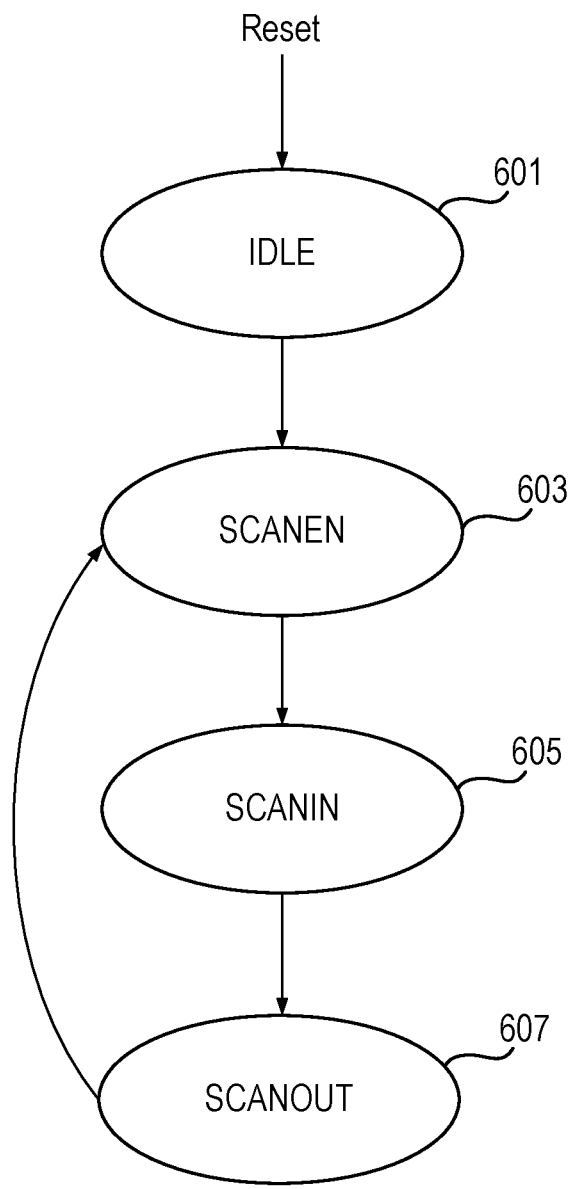
FIG. 6 illustrates a state diagram associated with another embodiment of a scan controller in a pin limited environment.
Figure 7:
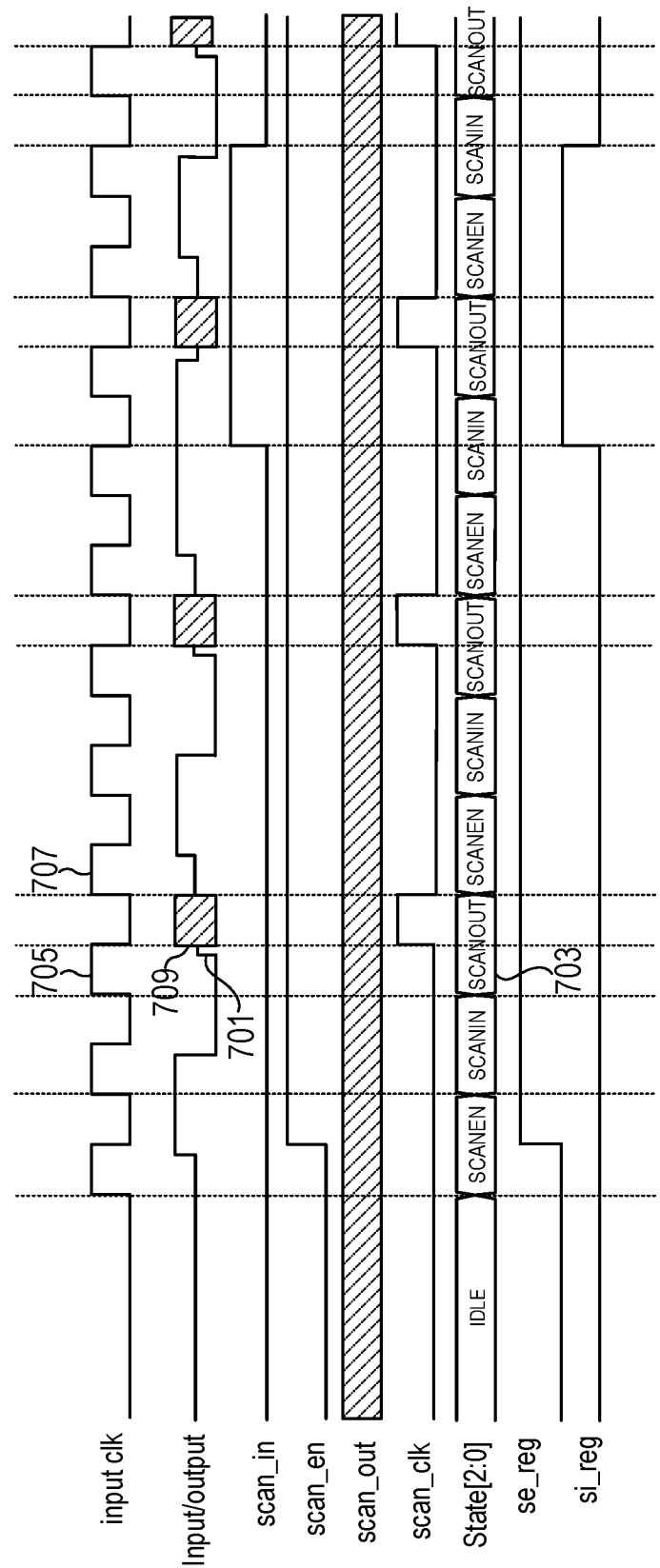
FIG. 7 illustrates a timing diagram associated with operation of the scan controller state machine illustrated in FIG. 6.

While the state machine embodiment shown in FIG. 4 has two scan states, other embodiments, utilize a single scan state. Referring to FIG. 6, the IDLE state 601, SCANEN state 603, and SCANIN 605 state correspond to the states 401, 403, and 405 shown in FIG. 4. The state machine has only a single scan out state 607. Referring to the timing diagram of FIG. 7, the tester stops driving the input/output signal line at 701. Note that the timing diagram of FIG. 7 assumes that the integrated circuit has already entered scan mode by writing the control register 315 (FIG. 3). While the scan controller is in the SCANOUT state 703 the scan clock (scan_clk) asserts on the falling edge of the input clock pulse 705 and deasserts on the rising edge of the next clock pulse 707. The scan out data from the digital core is driven on the input/output signal line at 709. Other embodiments may deassert the scan clock earlier. In the embodiment of FIG. 7, the rising edge of the input clock signal pulse 707 also causes the scan controller to stop driving the input/output signal line, which returns to the high impedance state to allow the tester to drive a value for the scan enable signal prior to the falling edge of the clock pulse 707. The rising edge of the clock pulse 707 transitions the state machine back to the SCANEN state and the scan sequence using the two pin external interface and the internal scan interface repeats until the scan operation completes.

The scan controller may be implemented with discrete logic, a programmed microcontroller, or a combination of discrete logic and a programmed microcontroller to achieve the functionality described in FIGS. 3-7 with appropriate software to implement the functionality stored in the integrated circuit.

Different implementations of the scan controller can be envisioned. For example, it is possible to encode scan in data and the input clock signal using various encoding techniques (e.g., pulse width modulation) and then the second external pin is used as an output terminal for scan out data. This can be beneficial if no input/output pins are available on the integrated circuit.

Thus, various aspects have been described relating scanning in a pin limited environment. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   receiving an input clock signal on an input terminal of an integrated circuit;
   writing an internal location in the integrated circuit to cause the integrated circuit to enter a scan mode;
   after entering the scan mode, transitioning from an idle state of a state machine to a scan enable state of the state machine;
   while in the scan enable state, storing a value of an input/output terminal into a scan enable storage element as a scan enable signal;
   transitioning from the scan enable state of the state machine to a scan in state of the state machine;
   while in the scan in state of the state machine, storing a value of the input/output terminal into a scan in data storage element as a scan in data bit;
   supplying the scan in data bit, the scan enable signal, and a scan clock signal in parallel to an internal scan interface of the integrated circuit, the internal scan interface including a scan enable signal line, a scan in signal line, a scan out signal line, and a scan clock signal line;
   transitioning from the scan in state of the state machine to a scan out state of the state machine; and
   while in the scan out state of the state machine supplying a scan out data bit over the input/output terminal.

2. The method as recited in claim 1 further comprising:
   receiving at the internal scan interface over the scan out signal line the scan out data bit from digital logic; and
   supplying the scan out data bit to the input/output terminal in synchronism with the input clock signal.

3. The method as recited in claim 1, further comprising:
   writing the internal location to thereby enable use of a two terminal external interface that includes the input/output terminal and the input terminal, for scan operations.

4. The method as recited in claim 3 further comprising prior to writing the internal location, using the two terminal external interface for other than scan operations.

5. The method as recited in claim 1 further comprising:
   storing the scan enable signal during a first period of the input clock signal;
   storing the scan in data bit during a second period of the input clock signal; and
   supplying the scan out data bit from a scan chain to the input/output terminal during a third period of the input clock signal.

6. The method as recited in claim 1 further comprising:
   writing the internal location in the integrated circuit to thereby enable use of a two terminal external interface, including the input/output terminal and the input terminal, for scan operations;
   after entering the scan mode, transitioning from the idle state of a state machine to the scan enable state of the state machine responsive to receiving a first transition of the input clock signal, the first transition causing the input clock signal to go from a first value to a second value;
   while in the scan enable state, storing the scan enable signal responsive to a second transition of the input clock signal, the second transition causing the input clock signal to go from the second value to the first value;
   transitioning from the scan enable state of the state machine to the scan in state of the state machine responsive to a third transition of the input clock signal from the first value to the second value; and
   while in the scan in state of the state machine, storing the scan in data bit responsive to a fourth transition of the input clock signal from the second value to the first value.

7. The method as recited in claim 6, further comprising:
transitioning from the scan in state of the state machine to the scan out state of the state machine responsive to a fifth transition of the scan clock signal from the first value to the second value;
while in the scan out state of the state machine, asserting the scan clock signal while the scan in signal line is supplied the scan in data bit and the scan enable signal line is supplied the scan enable signal; and
responsive to the asserting of the scan clock signal, shifting a scan chain coupled to the internal scan interface.

8. The method as recited in claim 7, further comprising:
the state machine transitioning from the scan out state to a second scan out state responsive to receiving another transition of the input clock signal; and
while in the second scan out state, deasserting the scan clock signal.

9. The method as recited in claim 6 further comprising:
receiving a reset signal prior to a scan operation to enter the idle state.

10. The method as recited in claim 6 further comprising performing additional scan operations including repeating the scan enable state, the scan in state, and the scan out state.

11. An integrated circuit comprising:
a two terminal external interface including an input terminal to receive an input clock signal and an input/output terminal to serially receive a scan enable signal and scan in data and to supply scan out data;
a scan controller coupled to the two terminal external interface and coupled to digital logic of the integrated circuit through an internal scan interface, the internal scan interface including a scan clock signal line, a scan in signal line, a scan out signal line, and a scan enable signal line, the scan controller to communicate in parallel with the internal scan interface to supply a scan clock to the scan clock signal line, the scan in data to the scan in signal line, the scan enable signal to the scan enable signal line and to receive the scan out data over the scan out signal line;
the scan controller further including a state machine to control scan operations using the two terminal external interface and the internal scan interface;
a scan enable storage element to store the scan enable signal received from the input/output terminal in synchronism with the input clock signal;
a scan data storage element to store the scan in data received from the input/output terminal;
wherein the scan controller is configured:
    after scan mode is enabled, to transition the state machine from an idle state to a scan enable state responsive to a first transition of the input clock signal;
    while in the scan enable state of the state machine, to store the scan enable signal responsive to a second transition of the input clock signal;
    to transition from the scan enable state to a scan in state responsive to receiving a third transition of the input clock signal; and
    while in the scan in state of the state machine, to store the scan in data responsive to a fourth transition of the input clock signal.

12. The integrated circuit as recited in claim 11, wherein the scan controller is further configured:
    to transition the state machine from the scan in state to a scan out state responsive to a fifth transition of the input clock signal; and
    while in the scan out state, to assert the scan clock supplied to the digital logic on the scan clock signal line while the scan in signal line has the scan in data and the scan enable signal line has the scan enable signal and to receive scan out data from the digital logic.

13. The integrated circuit as recited in claim 12, wherein the scan controller is further configured:
    to transition the state machine from the scan out state to a second scan out state responsive to receiving a sixth transition of the input clock signal; and
    while in the second scan out state, to deassert the scan clock supplied over the internal scan interface to the digital logic.

14. The integrated circuit as recited in claim 11, wherein the first transition is a rising edge and the second transition is a falling edge.

15. The integrated circuit as recited in claim 11, wherein the integrated circuit further comprises:
a control storage location writable from the two terminal external interface, the integrated circuit responsive to writing of the control storage location to enter a scan mode that uses the two terminal external interface and the internal scan interface to perform scan operations.

16. A method of performing scan operations in an integrated circuit comprising:
writing a control location in an integrated circuit through a write operation using an input terminal and an input/output terminal to cause the integrated circuit to enter a scan mode enabling use of a two terminal external interface including the input/output terminal and the input terminal for scan operations;
after entering the scan mode, transitioning from an idle state of a state machine in a scan controller in the integrated circuit to a scan enable state responsive to a first transition of an input clock signal received on the input terminal;
while in the scan enable state, storing a value on the input/output terminal of the integrated circuit into a scan enable storage element responsive to a second transition of the input clock signal;
transitioning from the scan enable state to a scan in state of the state machine responsive to a third transition of the input clock signal;
while in the scan in state of the state machine, storing a value on the input/output terminal into a scan in data storage element responsive to a fourth transition of the input clock signal;
transitioning from the scan in state of the state machine to a scan out state of the state machine responsive to a fifth transition of the input clock signal; and
while in the scan out state of the state machine, asserting a scan clock signal of an internal scan interface coupled to digital logic of the integrated circuit while the internal scan interface is supplied respective outputs of the scan in data storage element and the scan enable storage element.

17. The method as recited in claim 16, further comprising:
the state machine entering the idle state responsive to a power on reset.

18. The method as recited in claim 16 further comprising supplying scan out data over the input/output terminal during the scan out state.

* * * * *